(12) United States Patent
Kunieda et al.

(10) Patent No.: US 9,532,468 B2
(45) Date of Patent: Dec. 27, 2016

(54) PRINTED WIRING BOARD AND METHOD FOR MANUFACTURING PRINTED WIRING BOARD

(71) Applicant: IBIDEN Co., Ltd., Ogaki-shi (JP)

(72) Inventors: Masatoshi Kunieda, Ogaki (JP); Makoto Terui, Ogaki (JP); Ryoujiro Tominaga, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/549,951

(22) Filed: Nov. 21, 2014

(65) Prior Publication Data
US 2015/0136459 A1 May 21, 2015

(30) Foreign Application Priority Data

Nov. 21, 2013 (JP) ................. 2013-240660

(51) Int. Cl.
*H05K 1/09* (2006.01)
*H05K 1/11* (2006.01)
(Continued)

(52) U.S. Cl.
CPC ... *H05K 3/4682* (2013.01); *H01L 2224/16227* (2013.01); *H05K 1/0256* (2013.01); *H05K 1/0265* (2013.01); *H05K 1/09* (2013.01); *H05K 1/112* (2013.01); *H05K 1/113* (2013.01); *H05K 1/114* (2013.01); *H05K 1/185* (2013.01); *H05K 3/243* (2013.01); *H05K 3/244* (2013.01); *H05K 3/3436* (2013.01); *H05K 2201/0352* (2013.01); *H05K 2201/0391* (2013.01); *H05K 2201/0761* (2013.01); *H05K 2201/0769* (2013.01); *H05K 2201/094* (2013.01); *H05K 2201/0989* (2013.01); *H05K 2201/09736* (2013.01); *H05K 2201/10015* (2013.01); *H05K 2201/10636* (2013.01); *H05K 2201/10674* (2013.01); *H05K 2201/2081* (2013.01);
(Continued)

(58) Field of Classification Search
CPC ............ H05K 1/09; H05K 1/116; H05K 1/115
See application file for complete search history.

(56) References Cited

U.S. PATENT DOCUMENTS 8,541,695 B2 * 9/2013 Ishida et al. .................. 174/264

FOREIGN PATENT DOCUMENTS

JP 2012-191204 A 10/2012

* cited by examiner

*Primary Examiner* — Jeremy C Norris
(74) *Attorney, Agent, or Firm* — Oblon, McClelland, Maier & Neustadt, L.L.P.

(57) ABSTRACT

A wiring board includes a first resin insulating layer, conductor pads on the first insulating layer including first and second conductor pads, a second resin insulating layer on the first insulating layer covering the first and second pads, an outermost conductor layer on the second insulating layer including first and second outermost wiring layers, via conductors through the second insulating layer including a first via conductor connecting the first wiring layer and first pad and a second via conductor connecting the second wiring layer and second pad, and a solder resist layer on the second insulating layer such that the solder resist layer is covering the first wiring layer and has one or more openings exposing the second wiring layer. The first wiring layer includes first main metal, and the second wiring layer includes second main metal which is different from the first metal of the first wiring layer.

20 Claims, 8 Drawing Sheets

(51) Int. Cl.
    *H05K 3/46*     (2006.01)
    *H05K 1/02*     (2006.01)
    *H05K 1/18*     (2006.01)
    *H05K 3/24*     (2006.01)
    *H05K 3/34*     (2006.01)
(52) U.S. Cl.
    CPC ..... *H05K 2203/1394* (2013.01); *Y02P 70/611* (2015.11); *Y10T 29/49155* (2015.01)

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-240660, filed Nov. 21, 2013, the entire contents of which are incorporated herein by reference.

BACKGROUND OF THE INVENTION

Field of the Invention

The present invention relates to a printed wiring board, on which an IC chip is mounted, and a method for manufacturing the printed wiring board.

Description of Background Art

Japanese Patent Laid-Open Publication No. 2012-191204 describes a build-up multilayer printed wiring board that has a built-in electronic part and does not have a core substrate. The entire contents of this publication are incorporated herein by reference.

SUMMARY OF THE INVENTION

According to one aspect of the present invention, a wiring board includes a first resin insulating layer, conductor pads formed on the first resin insulating layer and including a first conductor pad and a second conductor pad, a second resin insulating layer formed on the first resin insulating layer such that the second resin insulating layer is covering the first conductor pad and the second conductor pad, an outermost surface conductor wiring layer formed on the second resin insulating layer and including a first outermost surface conductor wiring layer and a second outermost surface conductor wiring layer, via conductors penetrating through the second resin insulating layer and including a first via conductor connecting the first outermost surface conductor wiring layer and the first conductor pad and a second via conductor connecting the second outermost surface conductor wiring layer and the second conductor pad, and a solder resist layer formed on the second resin insulating layer such that the solder resist layer is covering the first outermost surface conductor wiring layer and has one or more opening portions exposing the second outermost surface conductor wiring layer. The first outermost surface conductor wiring layer includes a first main metal, and the second outermost surface conductor wiring layer includes a second main metal which is different from the first metal of the first outermost surface-layer conductor wiring layer.

According to another aspect of the present invention, a method for manufacturing a wiring board includes forming on a first resin insulating layer multiple conductor pads including a first conductor pad and a second conductor pad, forming a second resin insulating layer on the first resin insulating layer such that the second resin insulating layer covers the first conductor pad and the second conductor pad, forming in the second resin insulating layer a first opening portion and a second opening portion such that the first opening portion reaches the first conductor pad and the second opening portion reaches the second conductor pad, forming a seed layer on a surface of the second resin insulating layer such that the seed layer is formed in the first opening portion and the second opening portion, forming a first resist layer on the seed layer such that the first resist layer covers the second opening portion and exposes the first opening portion and the surface of the second resin insulating layer around the first opening portion, applying electrolytic plating of a first main metal such that a first via conductor is formed in the first opening portion and a first outermost surface conductor wiring layer is formed on an exposed portion of the second resin insulating layer, removing the first resist layer from the second resin insulating layer, forming a second resist layer such that the second resist layer covers the first outermost surface conductor wiring layer and exposes the second opening portion in the second resin insulating layer and a patterned portion of the surface of the second resin insulating layer around the second opening portion, applying electrolytic plating of a second main metal such that a second via conductor is formed in the second opening portion and a second outermost surface conductor wiring layer is formed on the patterned portion of the second resin insulating layer, removing the second resist layer from the second resin insulating layer, removing a portion of the seed layer exposed from the first outermost surface conductor wiring layer and the second outermost surface conductor wiring layer, and forming a solder resist layer such that the solder resist layer covers the first outermost surface conductor wiring layer and has one or more opening portion exposing the second outermost surface conductor wiring layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
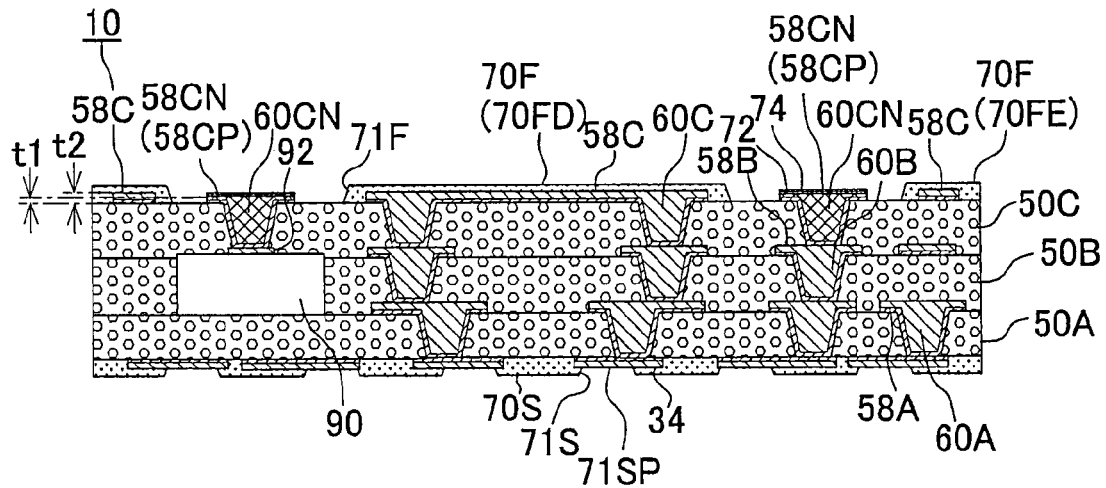
FIG. 1A illustrates a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Figure 1B:
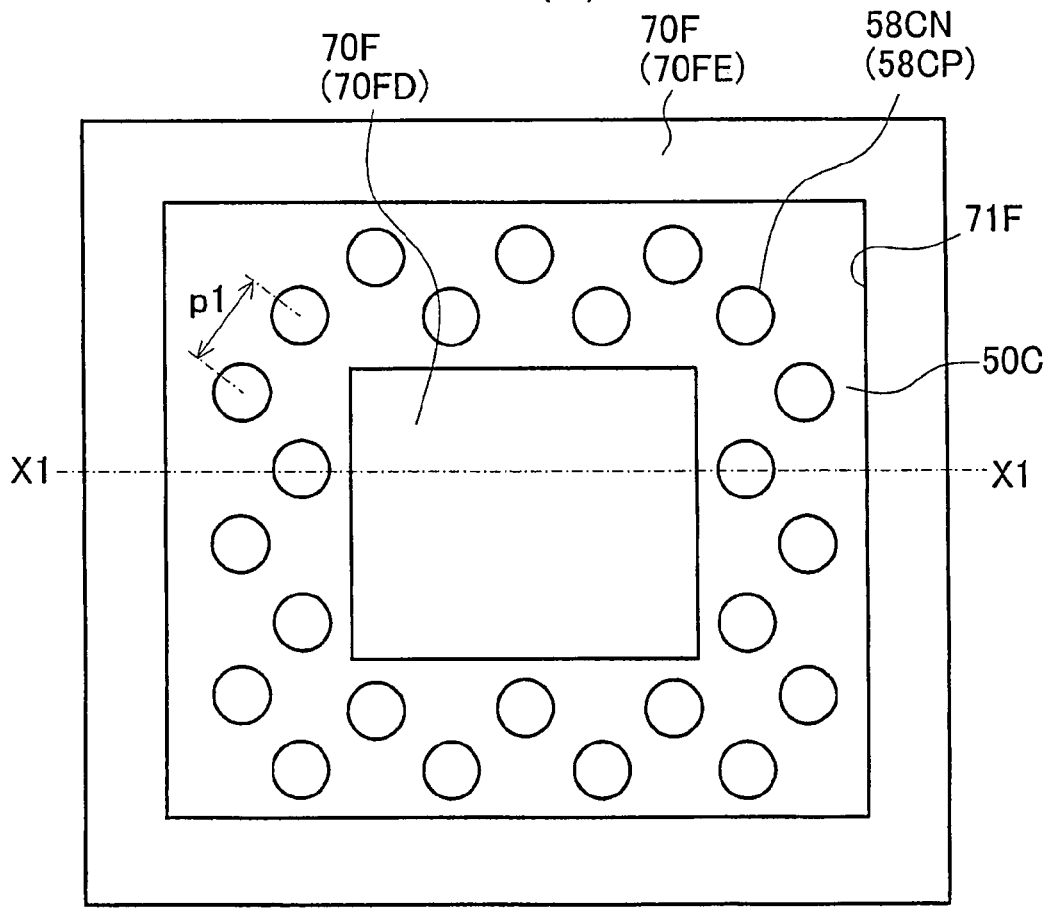
FIG. 1B illustrates a plan view of the printed wiring board.
Figure 2A:
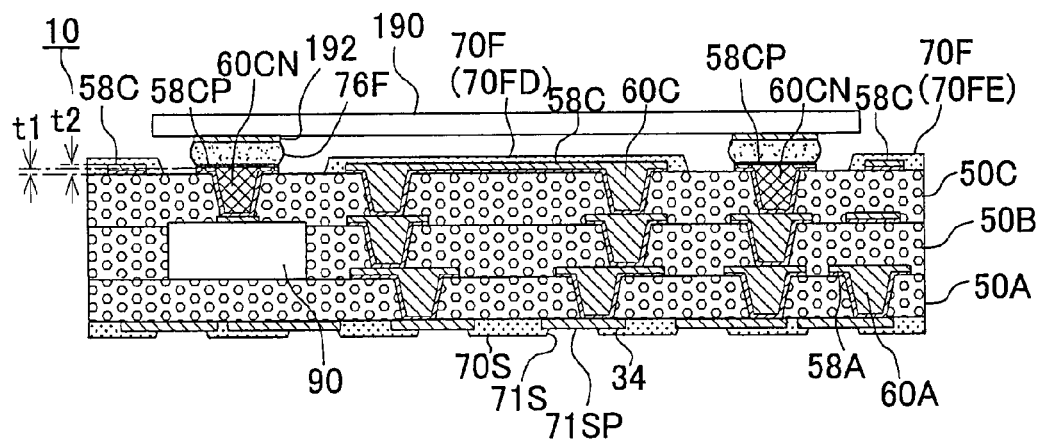
FIG. 2A illustrates a cross-sectional view of an application example of the printed wiring board according to the first embodiment.
Figure 2B:
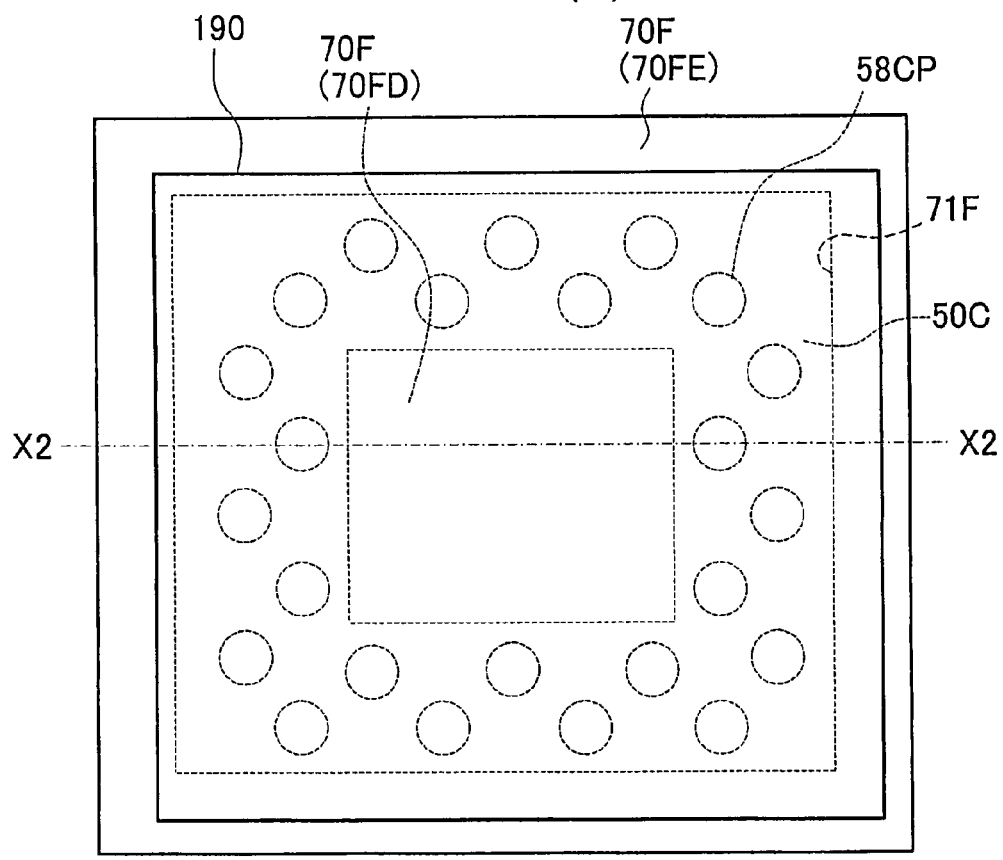
FIG. 2B illustrates a plan view of the application example of the printed wiring board.
Figure 3:
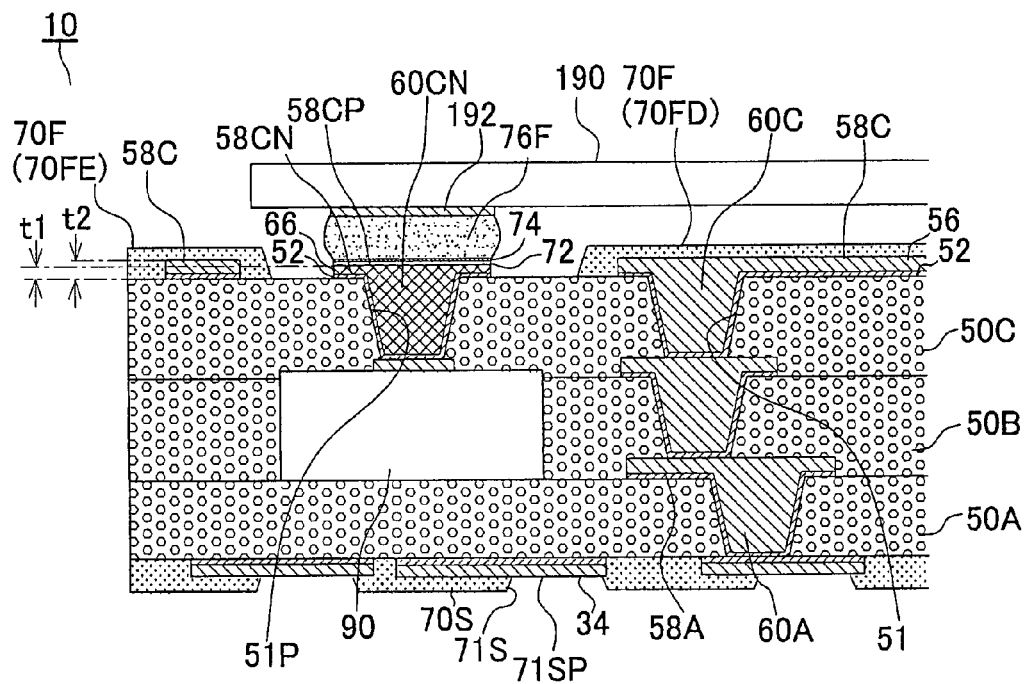
FIG. 3 illustrates an enlarged cross-sectional view of the printed wiring board of the first embodiment.

FIG. 1A illustrates a cross-sectional view of a printed wiring board of a first embodiment; and FIG. 1B illustrates a plan view of the printed wiring board. An X1-X1 cross section in FIG. 1B corresponds to FIG. 1A. FIG. 2A illustrates a cross-sectional view of an application example in which an IC chip is mounted on the printed wiring board of FIG. 1A; and FIG. 2B illustrates a plan view of the printed wiring board. An X2-X2 cross section in FIG. 2B corresponds to FIG. 2A. FIG. 3 illustrates a partial enlarged view of FIG. 2A.

As illustrated in FIG. 1A, a printed wiring board 10 has three resin insulating layers including a bottom-layer resin insulating layer (50A), an inner-layer resin insulating layer (first resin insulating layer) (50B) and a surface-layer resin insulating layer (second resin insulating layer) (50C). On a lower surface of the bottom-layer resin insulating layer (50A), a conductor wiring layer 34 is provided. On the conductor wiring layer 34, a solder resist layer (70S) is formed. A portion of the conductor wiring layer 34 that is exposed from an opening (71S) of the solder resist layer (70S) forms a pad (71SP). On an upper surface of the bottom-layer resin insulating layer (50A), a conductor wiring layer (58A) is formed. The conductor wiring layer (58A) and the conductor wiring layer 34 are connected by a via conductor (60A) that penetrates through the bottom-layer resin insulating layer (50A). On an upper surface of the inner-layer resin insulating layer (50B), a conductor wiring layer (58B) is formed. The conductor wiring layer (58B) and the conductor wiring layer (58A) are connected via a via conductor (60B) that penetrates through the inner-layer resin insulating layer (50B). In the inner-layer resin insulating layer (50B), an electronic part 90 that is formed, for example, from a chip capacitor is housed. On the surface-layer resin insulating layer 50, a copper wiring layer (first outermost surface-layer conductor wiring layer) (58C) and a nickel wiring layer (second outermost surface-layer conductor wiring layer) (58CN) are formed. The copper wiring layer (58C) and the conductor wiring layer (58B) are connected via a copper via conductor (first via conductor) (60C) that penetrates through the surface-layer resin insulating layer (50C). A connecting portion of the copper via conductor (60C) that connects to the conductor wiring layer (58B) forms a first conductor pad. The nickel wiring layer (58CN) and the conductor wiring layer (58B) are connected via a nickel via conductor (second via conductor) (60CN) that penetrates through the surface-layer resin insulating layer (50C). A connecting portion of the nickel via conductor (60CN) that connects to the conductor wiring layer (58B) forms a second conductor pad. Further, the nickel wiring layer (58CN) and an electrode 92 of the electronic part are connected via the nickel via conductor (second via conductor) (60CN). A connecting portion of the nickel via conductor (60CN) that connects to the electrode 92 forms a second conductor pad. The copper wiring layer (58C) is covered by a solder resist layer (70F). The nickel wiring layer (58CN) is exposed by an opening (71F) that is formed in the solder resist layer.

As illustrated in FIG. 1B, the solder resist layer (70F) includes a quadrangular central part (70FD) and an outer peripheral part (70FE). The opening (71F) is formed in a frame shape between the central part (70FD) and the outer peripheral part (70FE). The nickel wiring layer (58CN) is exposed by the opening (71F). The nickel wiring layer (58CN) is formed in a circular shape as a via land of the nickel via conductor, and, as illustrated in FIG. 2A, forms a pad (58CP) to which a terminal 192 of an IC chip 190 is connected via a solder bump (76F). The copper wiring layer (58C) includes a via land of the copper via conductor (60C) as a part thereof.

As illustrated in FIG. 3, on the pad (58CP), a Pd electrolytic plating film 72 and an Au electrolytic plating film 74 are formed. Here, the Pd electrolytic plating film and the Au electrolytic plating film are provided. However, it is also possible that only the Au electrolytic plating film is provided. The Pd electrolytic plating film and the Au electrolytic plating film are not formed in a side surface of the pad (58CP), and the nickel via conductor is exposed. Due to an oxide film of the nickel, solder wettability is reduced, and the solder bump (76F) is prevented from laterally spreading and causing short-circuiting. The nickel wiring layer (58CN) and the nickel via conductor (60CN) are formed from a copper seed layer 52 and a nickel plating film 66. On the other hand, the copper wiring layer (58C) and the copper via conductor (60C) are formed from the copper seed layer 52 and a copper plating film 56. A thickness (t1) of the nickel wiring layer (58CN) (including a thickness of the copper seed layer) is 5-10 μm. A thickness of the copper wiring layer (58C) (including the thickness of the copper seed layer) is 15-20 μm. The copper wiring layer (58C) is thicker. This is because the copper wiring layer (58C) is used as a signal line and a power line in a horizontal direction of the printed wiring board and thus a low resistance is desired. On the other hand, the nickel wiring layer (58CN) is used as a signal line and a power line in a perpendicular direction of the printed wiring board and signals and currents mainly flow through the nickel via conductor (60CN), and thus the nickel wiring layer (58CN) is not required to be thick. Further, since nickel plating is higher in cost than copper plating, a thin nickel wiring layer can result in low cost in manufacture.

As illustrated in FIG. 1B, it is desirable that a pitch (p1) (distance from a center of a pad to a center of another pad) of the pads (58CP) is 20-100 μM. When the pitch (p1) is 20 μm or less, insulation reliability cannot be ensured. When the pitch (p1) is 100 μm or more, it is superior in economic efficiency to provide an opening in the solder resist layer to expose the copper wiring.

In the printed wiring board of the first embodiment, the solder resist layer 70F covers the copper wiring layer (58C), and the nickel wiring layer (58CN) is exposed. By using the nickel wiring layer (58CN) that is exposed from the solder resist layer (70F) as pads for mounting an IC chip, fine-pitch pads can be formed. By using the nickel wiring layer (58CN) for the pads (58CP), migration is unlikely to occur even when a large current flows in the fine-pitch pads. Further, resistance against an impact when a device is dropped increases. On the other hand, by using the copper wiring layer (58C) as a signal line and a power line in the horizontal direction of the printed wiring board, as compared to nickel, low resistance and low manufacturing cost can be realized.

In the first embodiment, the nickel wiring layer is formed as a metal different from the copper wiring layer. However, in place of nickel, a metal mainly containing one of chromium, zinc, tin and tungsten can also be used.

Manufacturing Method of First Embodiment

With reference to FIG. 4A-6D, a method for manufacturing the printed wiring board of the first embodiment is described below.

Figure 4A:
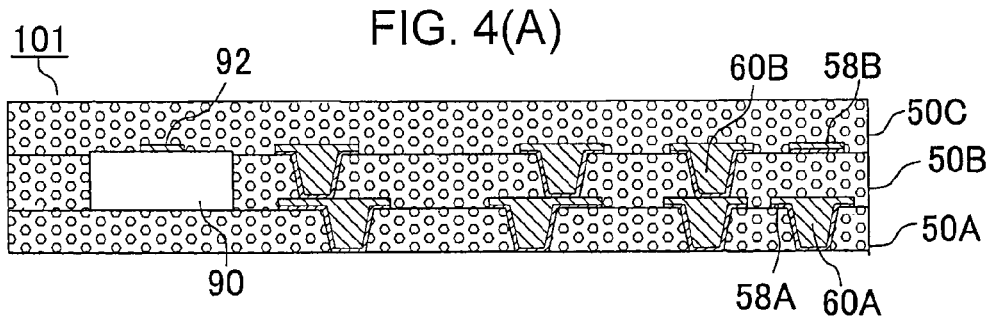
FIG. 4A-4D illustrate manufacturing process diagrams of the printed wiring board of the first embodiment.

(1) An intermediary body 101 as illustrated in FIG. 4A is formed. In the intermediary body 101, a conductor wiring layer (58A) is formed on an upper surface of a bottom-layer resin insulating layer (50A) that has a via conductor (60A); an inner-layer resin insulating layer (50B) that has a via conductor (60B) and houses an electronic part 90 is formed on the bottom-layer resin insulating layer (50A); a conductor wiring layer (58B) is formed on an upper surface of the inner-layer resin insulating layer (50B); and a surface-layer resin insulating layer (50C) is formed on the inner-layer resin insulating layer (50B). The intermediate body may be manufactured, for example, using a manufacturing method described in Japanese Patent Laid-Open Publication No. 2012-191204.

The electronic part 90 is not particularly limited and may be, for example, a semiconductor element, a passive part, or a semiconductor element with re-wiring that is formed on a semiconductor element. The bottom-layer resin insulating layer (50A), the inner-layer resin insulating layer (50B) and the surface-layer resin insulating layer (50C) are respectively formed from epoxy resin and each contain a component that easily dissolves in a roughening solution, a component that is difficult to dissolve in a roughening solution, an inorganic filler, and the like. Further, for example, a resin insulating layer may also contain a film-like glass cloth, and such a resin insulating layer may be obtained by impregnating a glass fiber cloth with epoxy resin and subjecting the impregnated glass fiber cloth to a thermal curing process. However, without being limited to this, materials of the respective resin insulating layers are arbitrary.

Figure 4B:
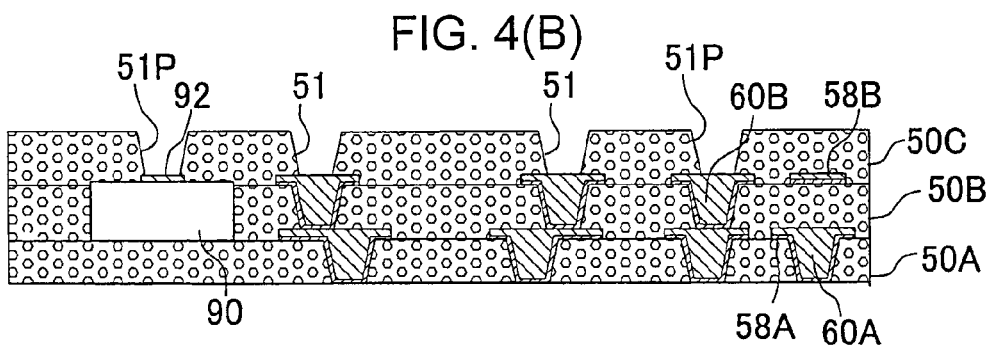

(2) A first opening 51 and a second opening (51P) reaching an electrode 92 and the conductor wiring layer (58B) are formed using laser in the surface-layer resin insulating layer (50C) (FIG. 4B). Here, the first opening 51 is an opening for a via in which a copper via conductor is formed, and the second opening (51P) is an opening for a via in which a nickel via conductor is formed.

Figure 4C:
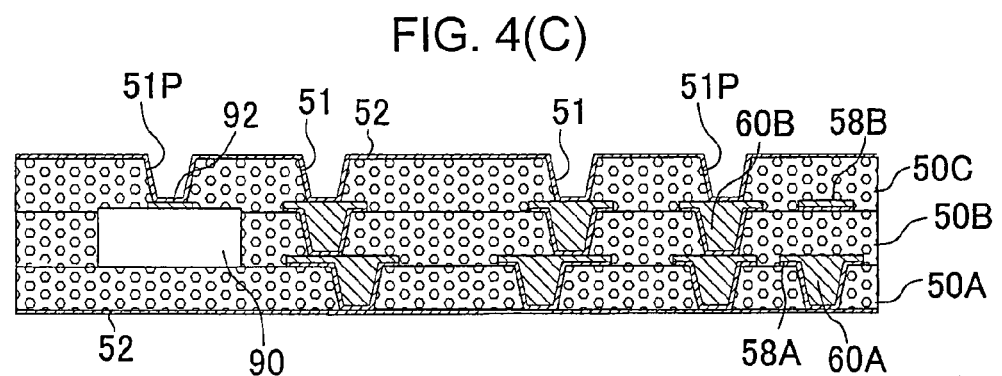

(3) A copper seed layer 52 having a thickness of 1 µm is formed by an electroless copper plating process on a surface of the surface-layer resin insulating layer (50C) and in the first opening 51 and the second opening (51P) (FIG. 4C).

Figure 4D:
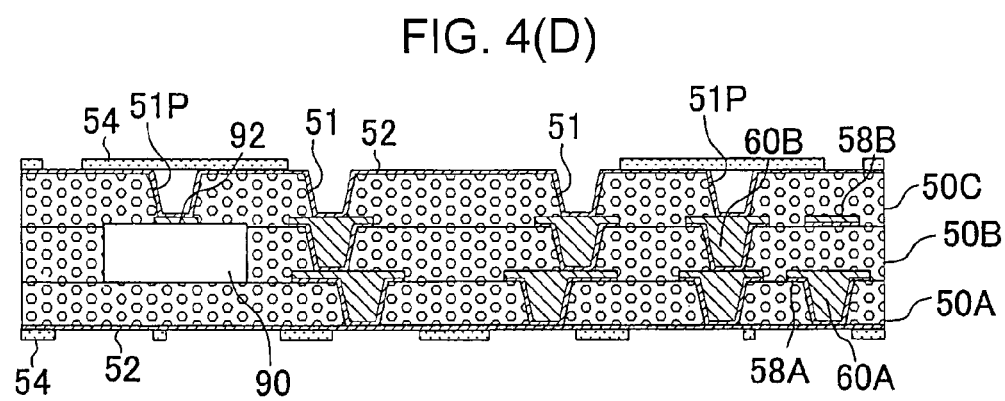

(4) A copper plating resist 54 of a predetermined pattern that includes an area above the second opening (51P) in which the nickel via conductor is formed is formed on the copper seed layer 52 (FIG. 4D).

Figure 5A:
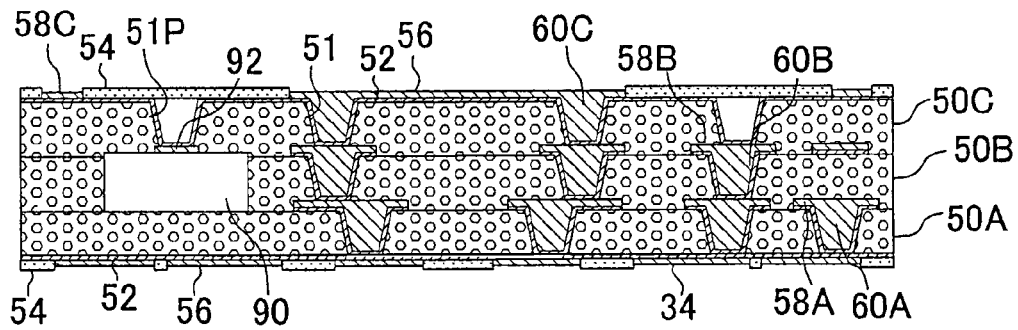
FIG. 5A-5D illustrate manufacturing process diagrams of the printed wiring board of the first embodiment.

(5) An electrolytic copper plating film 56 is formed by an electrolytic copper plating process in a non-forming part of the copper plating resist (FIG. 5A). In this case, the electrolytic copper plating film is filled in the copper seed layer 52 on an inner wall of the first opening 51 and a copper via conductor (60C) is formed. Further, a copper wiring layer (58C) that includes the copper seed layer 52 and the electrolytic copper plating film 56 is formed on an upper surface side, and a conductor wiring layer 34 is formed on a lower surface side. The copper wiring layer (58C) has a thickness of 15 µm-20 µm.

Figure 5B:
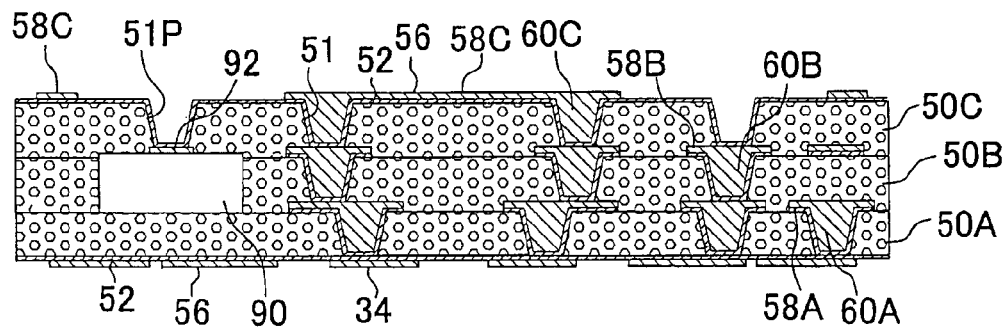

(6) The copper plating resist is peeled off (FIG. 5B). The copper seed layer 52 temporarily remains.

Figure 5C:
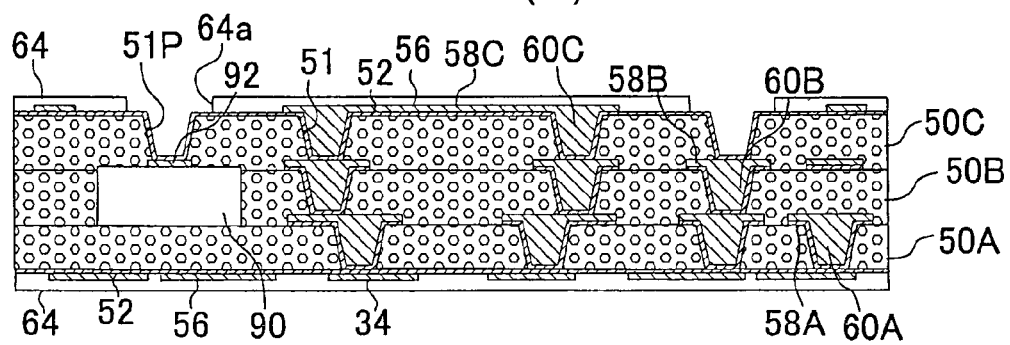

(7) A nickel plating resist 64 of a predetermined pattern including an area above the copper wiring layer (58C) is formed on the copper wiring layer (58C) and the copper seed layer 52 (FIG. 5C). The nickel plating resist 64 has a through hole (64a) around the second opening (51P).

Figure 5D:
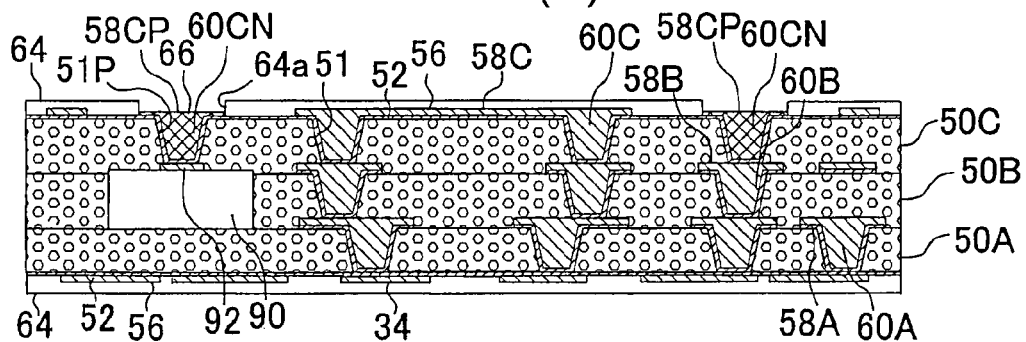

(8) An electrolytic nickel plating film 66 is formed by an electrolytic nickel plating process in the through hole (64a) of the nickel plating resist 64 (FIG. 5D). In this case, the electrolytic nickel plating film is filled in the copper seed layer 52 on an inner wall of the second opening (51P) and a nickel via conductor (60CN) is formed. Further, a nickel wiring layer (58CN) that includes the copper seed layer 52 and the electrolytic nickel plating film 66 is formed. The nickel wiring layer (58CN) has a thickness of 5-10 µm.

Figure 6A:
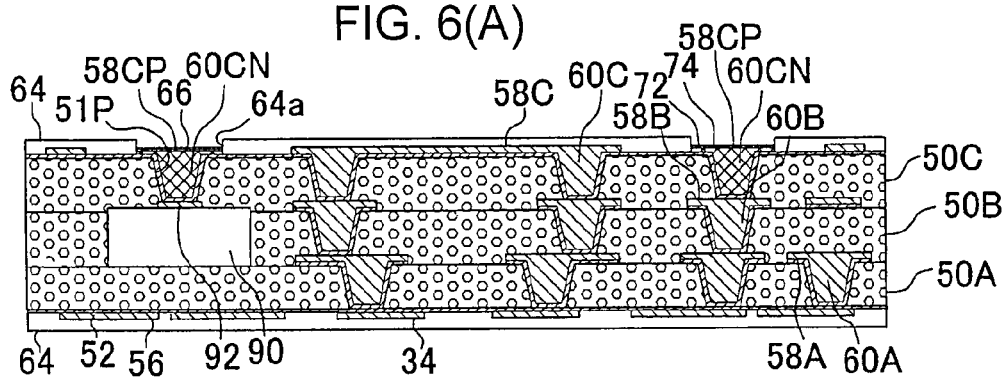
FIG. 6A-6D illustrate manufacturing process diagrams of the printed wiring board of the first embodiment.
Figure 6B:
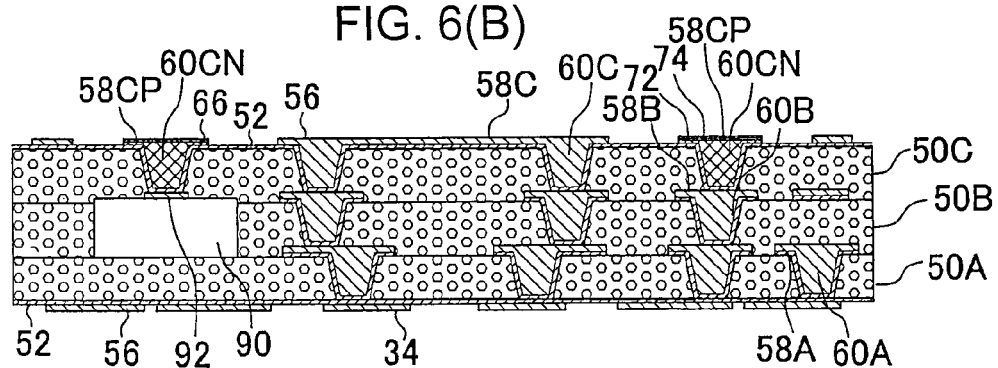

(9) In a state in which the nickel plating resist 64 remains, Pd electrolytic plating and Au electrolytic plating are performed. As a result, a Pd electrolytic plating film 72 and an Au electrolytic plating film 74 are formed on an upper surface of the nickel wiring layer (58CN) in the through hole (64a) of the plating resist 64 (FIG. 6A). As described above with reference to FIG. 3, the Pd electrolytic plating film and the Au electrolytic plating film are not formed on a side surface of a nickel wiring layer (pad) (58CP).

Figure 6C:
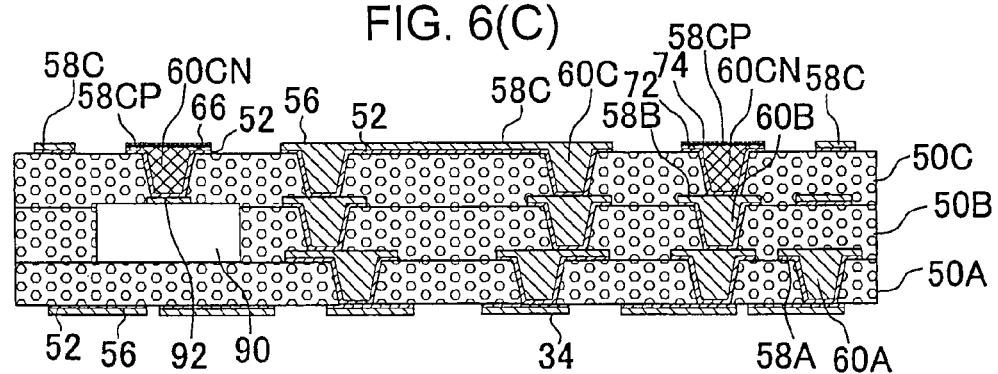

(10) After the nickel plating resist is peeled off (FIG. 6B), the copper seed layer 52 in non-forming parts of the electrolytic copper plating film 56 and the Au electrolytic plating film 74 is removed, and the nickel wiring layer (58CN), the copper wiring layer (58C) and the conductor wiring layer 34 are finally formed (FIG. 6C).

Figure 6D:
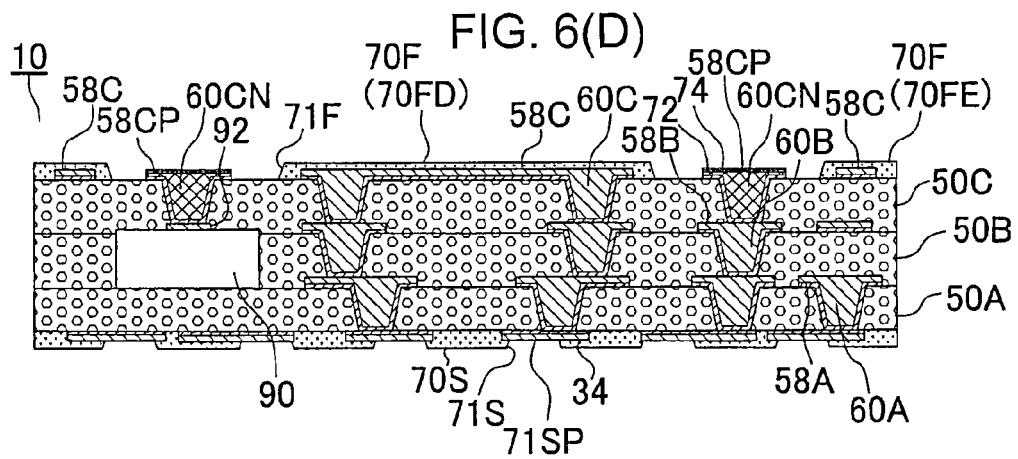

(11) A solder resist layer (70F) is formed on the surface-layer resin insulating layer (50C) and the copper wiring layer (58C), a solder resist layer (70S) is formed on the bottom-layer resin insulating layer (50A), and a printed wiring board is completed (FIG. 6D). The solder resist layer (70F) has an opening (71F) that exposes the nickel wiring layer (58CN) and the surface-layer resin insulating layer (50C) around the nickel wiring layer (58CN) (see FIG. 1B). The solder resist layer (70S) has an opening (71S) that exposes a pad part (71SP) of the conductor wiring layer 34. A metal film, such as a Ni/Au film, a Ni/Pd/Au file and a Sn film, or an OSP film can be formed on the pad part (71SP).

In the method for manufacturing the printed wiring board of the first embodiment, the copper seed layer 52 is formed on the surface of the surface-layer resin insulating layer (50C), in the first opening 51 and in the second opening (51P); and the copper plating resist 54 is formed that exposes the first opening 51 and the surface of the surface-layer resin insulating layer (50C) around the first opening, and covers the second opening (51P) (FIG. 4D). The copper via conductor (60C) is formed in the first opening 51 by electrolytic copper plating, and the copper wiring layer (58C) is formed on the exposed surface-layer resin insulating layer (FIG. 5B). The copper plating resist is peeled off, and the nickel plating resist 64 is formed that covers the copper wiring layer (58C) and exposes the second opening (51P) and the surface of the surface-layer resin insulating layer of a predetermined pattern around the second opening (FIG. 5C). The nickel via conductor (60CN) is formed in the second opening (51P) by the electrolytic nickel plating, and the nickel wiring layer (58CN) is formed on the exposed surface-layer resin insulating layer (FIG. 5D). Therefore, the copper wiring layer (58C) and the nickel wiring layer (58CN) that are formed from different metals can be formed. Here, the copper wiring layer and the nickel wiring layer are formed using the common copper seed layer 52. Therefore, a wiring layer of two kinds of metals can be reasonably manufactured.

Next, the solder resist layer (70F) is formed that covers the copper wiring layer (58C) and exposes the nickel wiring layer (58CN) (FIG. 6D). By forming the pads (58CP) that are exposed from the solder resist layer using the nickel wiring layer (58CN), migration is unlikely to occur even when a large current flows in the fine-pitch pads. Further, resistance against an impact when a device is dropped increases. On the other hand, by using the copper wiring layer (58C) for wiring covered by the solder resist layer, as compared to nickel, low resistance and low manufacturing cost can be realized.

Modified Example of First Embodiment

Figure 7A:
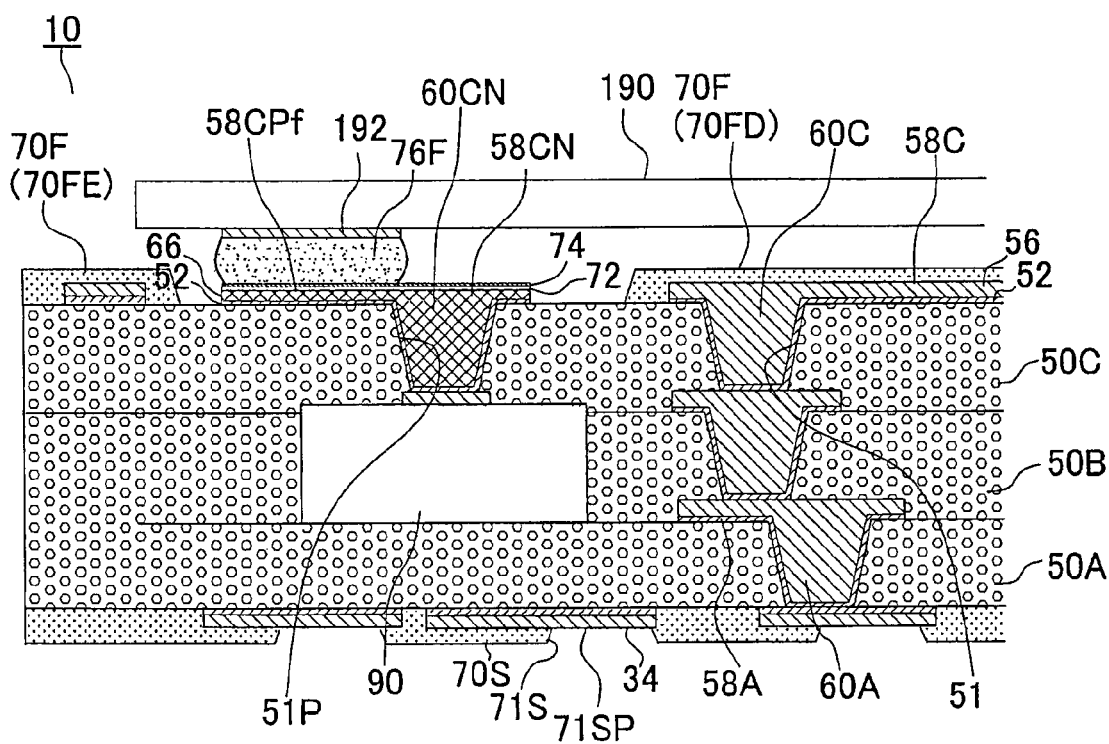
FIG. 7A illustrates a cross-sectional view of a printed wiring board of a first modified example of the first embodiment.
Figure 7B:
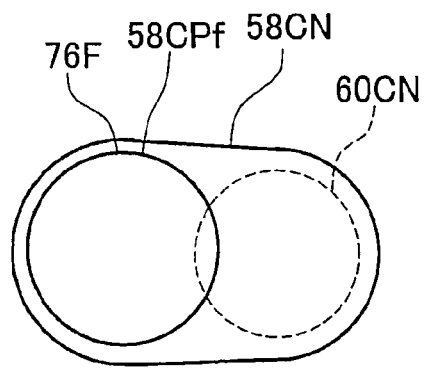
FIG. 7B illustrates a plan view of a pad.

FIG. 7A illustrates a cross-sectional view of a printed wiring board according to a modified example of the first embodiment; and FIG. 7B illustrates a plan view of a nickel wiring layer (58CN) of the printed wiring board. The nickel wiring layer (58CN) laterally spreads from a via land of a nickel via conductor (60CN), and has a pad part (58CPf) to which a solder bump (76F) is connected. The whole nickel via conductor (60CN) is exposed from a solder resist layer (70F).

Second Embodiment

Figure 8A:
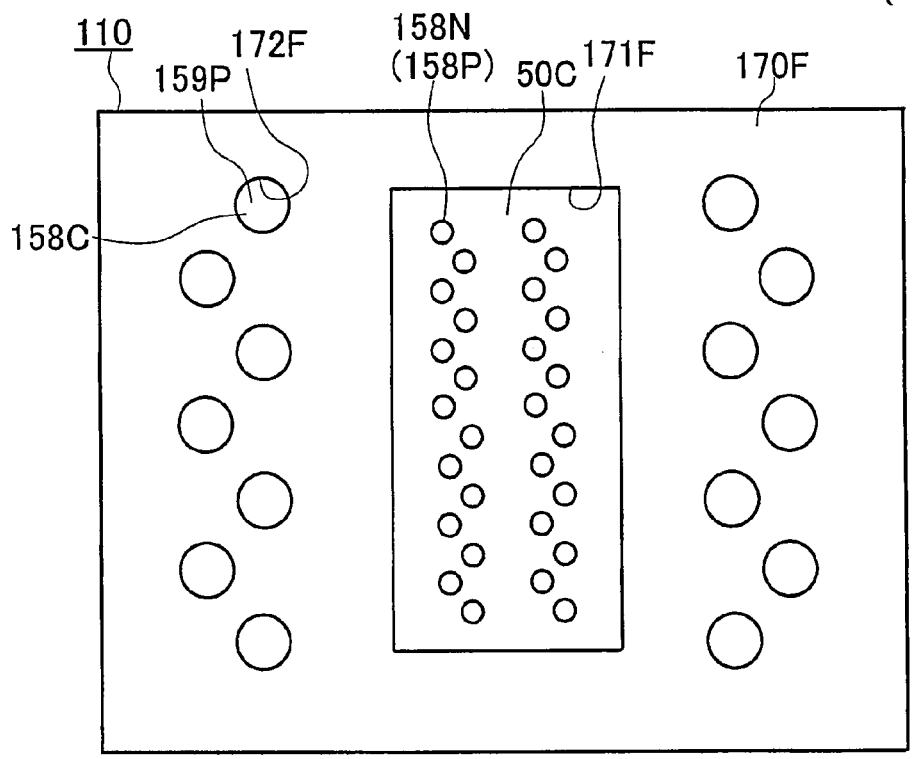
FIGS. 8A and 8B illustrate plan views of a printed wiring board of a second embodiment.
Figure 8B:
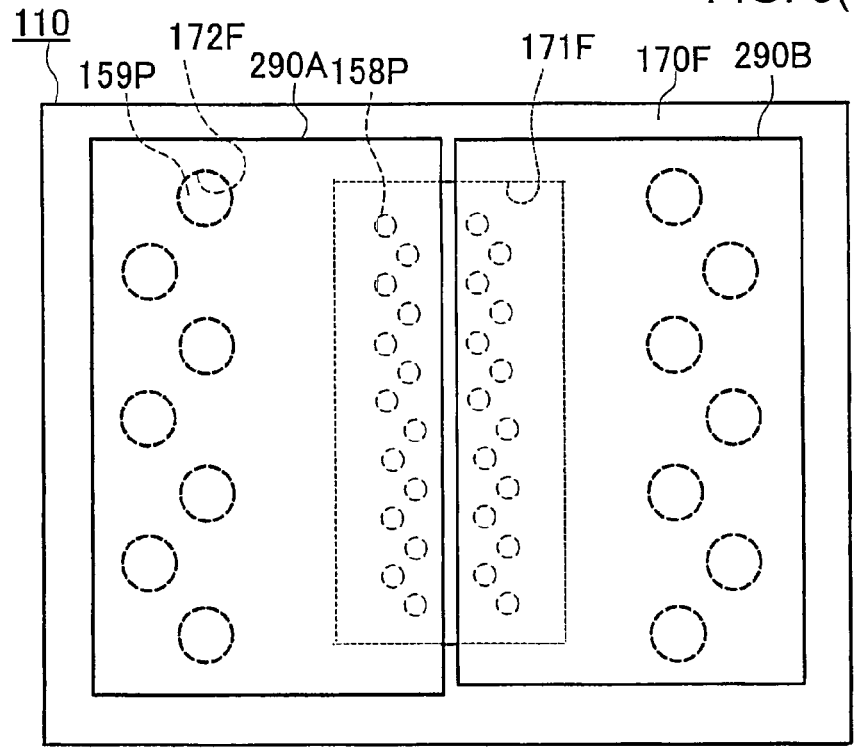

FIGS. 8A and 8B illustrate plan views of a printed wiring board of a second embodiment: FIG. 8A illustrates a state before mounting of an IC chip, and FIG. 8B illustrates a state after mounting of an IC chip. As illustrated in FIG. 8A, a solder resist layer (170F) on a surface of a printed wiring board 110 has an opening (171F), at a central portion, that exposes a surface of a surface-layer resin insulating layer (50C) and pads (158P) that are formed from a nickel wiring layer (158N); and circular openings (172F), on end sides on both sides, that expose pad parts 159 of a copper wiring layer (158C) that is formed below a solder resist layer.

FIG. 8B illustrates a state in which IC chips (290A, 290B) are mounted on the printed wiring board 110. Fine-pitch lands of the IC chips (290A, 290B) are connected to the pads (158P) at the central portion, and large-diameter lands of the IC chips (290A, 290B) are connected to the pad parts (159P) that are made of copper and are formed in the openings of the solder resist layer. In the second embodiment, the fine-pitch lands and large-diameter lands can be optimally connected.

INDUSTRIAL APPLICABILITY

In the above-described embodiments, a coreless build-up multilayer printed wiring board is described as an example. However, a structure according to an embodiment of the present invention can also be applied to a build-up printed wiring board having a core substrate.

When pads on which an IC chip is mounted are provided in openings of a solder resist layer, providing fine-pitch openings in a solder resist layer is difficult. Therefore, it is difficult to form pads for mounting an IC chip at a fine pitch. Pads may be formed at a fine pitch when the pads for mounting an IC chip are exposed and formed on a resin insulating layer without providing a solder resist layer. However, migration occurs in copper pads and reliability decreases. In particular, when a large current flows in pads for a power line, migration is likely to occur. Further, due to an impact when an electronic device, such as a mobile phone, in which the printed wiring board is mounted, is dropped, a pad easily comes off when there is not a solder resist layer, and thus, resistance of the device against the impact when the device is dropped decreases.

A printed wiring board according to an embodiment of the present invention and a method for manufacturing a printed wiring board according to an embodiment of the present invention allow mounting pads at a fine pitch.

A printed wiring board according to an embodiment of the present invention includes: a first resin insulating layer; a first conductor pad and a second conductor pad that are formed on the first resin insulating layer; a second resin insulating layer that is formed on the first resin insulating layer, the first conductor pad and the second conductor pad; a first outermost surface-layer conductor wiring layer and a second outermost surface-layer conductor wiring layer that are formed on the second resin insulating layer; a first via conductor that penetrates through the second resin insulating layer and connects the first outermost surface-layer conductor wiring layer and the first conductor pad; and a second via conductor that penetrates through the second resin insulating layer and connects the second outermost surface-layer conductor wiring layer and the second conductor pad. Further, a solder resist layer is provided that covers the first outermost surface-layer conductor wiring layer and exposes the second outermost surface-layer conductor wiring layer. The first outermost surface-layer conductor wiring layer and the second outermost surface-layer conductor wiring layer are formed from different metals.

A method for manufacturing a printed wiring board according to an embodiment of the present invention includes: forming a first conductor pad and a second conductor pad on a first resin insulating layer; forming a second resin insulating layer on the first resin insulating layer, the first conductor pad and the second conductor pad; forming, on the second resin insulating layer, a first opening that reaches the first conductor pad and a second opening that reaches the second conductor pad; forming a seed layer on a surface of the second resin insulating layer, in the first opening and in the second opening; forming a first resist layer that exposes the first opening and the surface of the second resin insulating layer around the first opening and covers the second opening; forming a first via conductor in the first opening by electrolytic copper plating and forming a first outermost surface-layer conductor wiring layer on the exposed second resin insulating layer; peeling off the first resist layer; forming a second resist layer that covers the first outermost surface-layer conductor wiring layer and exposes the second opening and the surface of the second resin insulating layer of a predetermined pattern around the second opening; forming a second via conductor in the second opening by electrolytic nickel plating and forming a second outermost surface-layer conductor wiring layer on the exposed second resin insulating layer; peeling off the second resist layer; removing the seed layer that is exposed from the first outermost surface-layer conductor wiring layer and the second outermost surface-layer conductor wiring layer; and forming a solder resist layer that covers the first outermost surface-layer conductor wiring layer and exposes the second outermost surface-layer conductor wiring layer.

In a printed wiring board according to an embodiment of the present invention, the solder resist layer covers the first outermost surface-layer conductor wiring layer and exposes the second outermost surface-layer conductor wiring layer. By using the second outermost surface-layer conductor wiring layer that is exposed from the solder resist layer as pads for mounting an IC chip, fine-pitch pads can be formed. The first outermost surface-layer conductor wiring layer and the second outermost surface-layer conductor wiring layer are formed from different metals. For example, by using nickel for the second outermost surface-layer conductor wiring layer that is used as pads, migration is unlikely to occur even when a large current flows in the fine-pitch pads. Further, resistance against an impact when a device is dropped increases. On the other hand, for example, by using copper for the first outermost surface-layer conductor wiring layer, as compared to nickel, low resistance and low manufacturing cost can be realized.

In a method for manufacturing a printed wiring board according to an embodiment of the present invention, the seed layer is formed on the surface of the second resin insulating layer, in the first opening and in the second opening; and the first resist layer is formed that exposes the first opening and the surface of the second resin insulating layer around the first opening, and covers the second opening. The first via conductor is formed in the first opening by electrolytic copper plating, and the first outermost surface-layer conductor wiring layer is formed on the exposed second resin insulating layer. The first resist layer is peeled off, and the second resist layer is formed that covers the first outermost surface-layer conductor wiring layer and exposes the second opening and the surface of the second resin insulating layer of a predetermined pattern around the second opening. The second via conductor is formed in the second opening by electrolytic nickel plating, and the second outermost surface-layer conductor wiring layer is formed on the exposed second resin insulating layer. Therefore, the first outermost surface-layer conductor wiring layer can be formed using copper, and the second outermost surface-layer conductor wiring layer can be formed using nickel. Here, the first outermost surface-layer conductor wiring layer of copper and the second outermost surface-layer conductor wiring layer of nickel are formed using the common seed layer. Therefore, a wiring layer of two kinds of metals can be reasonably manufactured. Next, the solder resist layer is formed that covers the first outermost surface-layer conductor wiring layer and exposes the second outermost surface-layer conductor wiring layer. By using nickel for the second outermost surface-layer conductor wiring layer that is used as pads that are exposed from the solder resist layer, migration is unlikely to occur even when a large current flows in the fine-pitch pads. Further, resistance against an impact when a device is dropped increases. On the other hand, by using copper for the first outermost surface-layer conductor wiring layer that is covered by the solder resist layer, as compared to nickel, low resistance and low manufacturing cost can be realized.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
    a first resin insulating layer;
    a plurality of conductor pads formed on the first resin insulating layer and comprising a first conductor pad and a second conductor pad;
    a second resin insulating layer formed on the first resin insulating layer such that the second resin insulating layer is covering the first conductor pad and the second conductor pad;
    an outermost surface conductor wiring layer formed on the second resin insulating layer and comprising a first outermost surface conductor wiring layer and a second outermost surface conductor wiring layer;
    a plurality of via conductors penetrating through the second resin insulating layer and comprising a first via conductor connecting the first outermost surface conductor wiring layer and the first conductor pad and a second via conductor connecting the second outermost surface conductor wiring layer and the second conductor pad; and
    a solder resist layer formed on the second resin insulating layer such that the solder resist layer is covering the first outermost surface conductor wiring layer and has at least one opening portion exposing the second outermost surface conductor wiring layer,
    wherein the first via conductor and the first outermost surface conductor wiring layer comprise a first main metal, and the second via conductor and the second outermost surface conductor wiring layer comprise a second main metal which is different from the first main metal of the first via conductor and first outermost surface conductor wiring layer.

2. A wiring board according to claim 1, wherein the first main metal of the first outermost surface conductor wiring layer is copper, and the second main metal of the second outermost surface conductor wiring layer is a metal selected from the group consisting of nickel, chromium, zinc, tin and tungsten.

3. A wiring board according to claim 1, wherein the first outermost surface conductor wiring layer comprises an electrolytic plated layer, and the second outermost surface conductor wiring layer comprises an electrolytic plated layer.

4. A wiring board according to claim 3, wherein the first outermost surface conductor wiring layer and the second outermost surface conductor wiring layer include a common seed layer.

5. A wiring board according to claim 2, wherein the second main metal of the second outermost surface conductor wiring layer is nickel and includes one of a Pd/Au layer and a Au layer formed on a surface of the second main metal of the second outermost surface conductor wiring layer.

6. A wiring board according to claim 5, wherein the one of a Pd/Au layer and a Au layer formed on the surface of the second main metal of the second outermost surface conductor wiring layer is an electrolytic plated layer.

7. A wiring board according to claim 1, wherein the first outermost surface conductor wiring layer has a thickness which is greater than a thickness of the second outermost surface conductor wiring layer.

8. A wiring board according to claim 1, wherein the second outermost surface conductor wiring layer comprises a plurality of connection pads.

9. A wiring board according to claim 1, wherein the second outermost surface conductor wiring layer comprises a plurality of connection pads positioned at a pitch of 20 µm to 100 µm.

10. A wiring board according to claim 1, wherein the solder resist layer has a plurality of opening portions positioned such that the plurality of opening portions is exposing a plurality of pad portions of the first outermost surface conductor wiring layer.

11. A wiring board according to claim 2, wherein the first outermost surface conductor wiring layer has a thickness which is greater than a thickness of the second outermost surface conductor wiring layer.

12. A wiring board according to claim 2, wherein the second outermost surface conductor wiring layer comprises a plurality of connection pads.

13. A wiring board according to claim 1, wherein the second outermost surface conductor wiring layer comprises a plurality of connection pads, and the solder resist layer has a plurality of opening portions positioned such that the plurality of opening portions is exposing a plurality of pad portions of the first outermost surface conductor wiring layer.

14. A wiring board according to claim 1, wherein the second outermost surface conductor wiring layer comprises a plurality of connection pads positioned to mount an electronic component.

15. A wiring board according to claim 1, wherein the first outermost surface conductor wiring layer has a thickness which is greater than a thickness of the second outermost surface conductor wiring layer, the second outermost surface conductor wiring layer comprises a plurality of connection pads, and the solder resist layer has a plurality of opening portions positioned such that the plurality of opening portions is exposing a plurality of pad portions of the first outermost surface conductor wiring layer.

16. A method for manufacturing a wiring board, comprising:

forming on a first resin insulating layer a plurality of conductor pads comprising a first conductor pad and a second conductor pad;

forming a second resin insulating layer on the first resin insulating layer such that the second resin insulating layer covers the first conductor pad and the second conductor pad;

forming in the second resin insulating layer a first opening portion and a second opening portion such that the first opening portion reaches the first conductor pad and the second opening portion reaches the second conductor pad;

forming a seed layer on a surface of the second resin insulating layer such that the seed layer is formed in the first opening portion and the second opening portion;

forming a first resist layer on the seed layer such that the first resist layer covers the second opening portion and exposes the first opening portion and the surface of the second resin insulating layer around the first opening portion;

applying electrolytic plating of a first main metal such that a first via conductor comprising the first main metal is formed in the first opening portion and a first outermost surface conductor wiring layer comprising the first main metal is formed on an exposed portion of the second resin insulating layer;

removing the first resist layer from the second resin insulating layer;

forming a second resist layer such that the second resist layer covers the first outermost surface conductor wiring layer and exposes the second opening portion in the second resin insulating layer and a patterned portion of the surface of the second resin insulating layer around the second opening portion;

applying electrolytic plating of a second main metal such that a second via conductor comprising the second main metal is formed in the second opening portion and a second outermost surface conductor wiring layer comprising the second main metal is formed on the patterned portion of the second resin insulating layer;

removing the second resist layer from the second resin insulating layer;

removing a portion of the seed layer exposed from the first outermost surface conductor wiring layer and the second outermost surface conductor wiring layer; and forming a solder resist layer such that the solder resist layer covers the first outermost surface conductor wiring layer and has at least one opening portion exposing the second outermost surface conductor wiring layer, wherein the second main metal of the second via conductor and second outermost surface conductor wiring layer is different from the first main metal of the first via conductor and first outermost surface conductor wiring layer.

17. A method for manufacturing a wiring board according to claim 16, further comprising:

forming one of a Pd/Au electrolytic plated layer and a Au electrolytic plated layer on a surface of the second outermost surface conductor wiring layer prior to the removing of the second resist layer.

18. A method for manufacturing a wiring board according to claim 16, wherein the first main metal of the electrolytic plating is copper, and the second main metal of the electrolytic plating is a metal selected from the group consisting of nickel, chromium, zinc, tin and tungsten.

19. A method for manufacturing a wiring board according to claim 16, further comprising:

forming one of a Pd/Au electrolytic plated layer and a Au electrolytic plated layer on a surface of the second outermost surface conductor wiring layer prior to the removing of the second resist layer, wherein the first main metal of the electrolytic plating is copper, and the second main metal of the electrolytic plating is a metal selected from the group consisting of nickel, chromium, zinc, tin and tungsten.

20. A method for manufacturing a wiring board according to claim 16, wherein the first main metal of the electrolytic plating is copper, and the second main metal of the electrolytic plating is nickel.

* * * * *